United States Patent [19]

Mori et al.

[11] Patent Number: 4,851,676
[45] Date of Patent: Jul. 25, 1989

[54] ELECTRON BEAM IMAGE RECORDING USING STIMULABLE PHOSPHOR SHEETS OF REDUCED THICKNESS AND/OR WITH NO PROTECTIVE LAYER

[75] Inventors: Nobufumi Mori; Yuichi Hosoi; Kenji Takahashi, all of Kanagawa, Japan

[73] Assignee: Fuji Photo Film Co., Ltd., Kanagawa, Japan

[21] Appl. No.: 293,573

[22] Filed: Jan. 3, 1989

Related U.S. Application Data

[60] Continuation of Ser. No. 143,419, Jan. 13, 1988, abandoned, which is a division of Ser. No. 799,261, Nov. 18, 1985, abandoned.

[30] Foreign Application Priority Data

Nov. 16, 1984 [JP] Japan ................................ 59-240456
Nov. 16, 1984 [JP] Japan ................................ 59-240457
Nov. 16, 1984 [JP] Japan ................................ 59-240458

[51] Int. Cl.$^4$ .......................... G03B 42/00; G01T 1/00
[52] U.S. Cl. ................................ 250/327.2; 250/397; 250/484.1
[58] Field of Search ................... 250/311, 327.2, 397, 250/484.1

[56] References Cited

U.S. PATENT DOCUMENTS

| | | | |
|---|---|---|---|
| 3,859,527 | 1/1975 | Luckey | 250/327.2 |
| 4,206,349 | 6/1980 | Kamimura | 250/327.2 |
| 4,239,968 | 12/1980 | Kotera et al. | 250/327.2 |
| 4,380,702 | 4/1983 | Takahashi et al. | 250/327.2 |

*Primary Examiner*—Constantine Hannaher
*Attorney, Agent, or Firm*—Gerald J. Ferguson, Jr.

[57] ABSTRACT

A method for recording and reproducing an electron beam image information comprising:

recording an electron beam image transmitted through reflected from the sample as an electron beam energy latent image on a stimulable phosphor sheet comprising a stimulable phosphor layer having a thickness in the range of 10 to 150 $\mu$m or an exposed stimulable phosphor layer with no protective layer;

irradiating said stimulable phosphor sheet with an electromagnetic wave to release at least a portion of electron beam energy stored in said stimulable phosphor sheet as stimulated emission;

detecting the stimulated emission; and photoelectrically processing the detected stimulated emission to obtain an electron beam image information of the sample.

5 Claims, 3 Drawing Sheets

THICKNESS OF PHOSPHOR LAYER ($\mu$m)

ELECTRON BEAM IMAGE RECORDING USING STIMULABLE PHOSPHOR SHEETS OF REDUCED THICKNESS AND/OR WITH NO PROTECTIVE LAYER

This application is a continuation of Ser. No. 143,419, filed Jan. 3, 1988, now abandoned which itself was a divisional of application Ser. No. 799,261.

BACKGROUND OF THE INVENTION

1. Field of the Invention

This invention relates to a method for recording and reproducing an electron beam image information, and more particularly to a method for recording and reproducing an electron beam image information, which enables an electron beam image transmitted through or reflected from a sample to be recorded and reproduced with high sensitivity and high accuracy.

2. Description of Prior Arts

There have been known electron microscope devices or electron diffraction devices in which a sample is irradiated with an electron beam under vacuum to obtain a transmitted electron beam image or a reflected electron beam image. In the electron microscope device, the diffraction pattern of a sample is formed on the back focal plane of a objection lens by an electron beam transmitted through the sample, and the enlarged image of the sample is formed by the interference of a diffracted beam. Thus, if the enlarged image is projected by means of a projection lens, the enlarged image (scattered image) of the sample can be observed. Further, if the diffraction pattern on the back focal plane is projected, the diffraction pattern of the enlarged sample can be observed. If an intermediate lens is provided between the objective lens and the projection lens, the enlarged image (scattered image) or the diffraction pattern can be optionally observed by adjusting the focal distance of the intermediate lens. In the electron diffraction device, there are a reflection method wherein the surface of a sample is irradiated with an electron beam and a reflected diffraction beam is recorded to obtain a diffraction pattern, and a transmission method wherein a diffracted beam transmitted through a sample is recorded to obtain a diffraction pattern.

In order to convert the enlarged image or the diffraction pattern (both are hereinafter referred to as electron beam image) into a visible image, there are used methods wherein a photogaphic film is arranged on an image formation plane to record the electron beam image thereon, or an image intensifier is provided to produce the intensified projection of the electron beam image. However, the photographic film has disadvantages in that the film is not sensitive enough to an electron beam and its development is not easy. The image intensifier has also disadvantages in that the sharpness of the image is poor and the image is liable to have distortion.

The electron beam image recorded as described above is generally subjected to image processings such as gradation processing, frequency intensifying processing, density processing, substraction processing and addition processing; the reconstruction of a three-dimensional image by Fourier analysis method; image analysis for the measurement of particle diameter and forming binary image; and diffraction pattern processing (crystal information, clarification of lattice constant, transition, lattice defect, etc.) to make the image more easy to observe. Such processings have been conducted, and a visible image obtained by developing the photographic film has been read by means of a microphotometer and converted into an electric signal which has been then subjected to A/D conversion and processed by a computer. The image has been conventionally subjected to the above-described complicated operation.

SUMMARY OF THE INVENTION

An object of the present invention is to provide a method for recording and reproducing an electron beam image information, which enables various information (hereinafter referred to as electron beam image information) of an electron beam image or corresponding to said electron beam image to be recorded and reproduced with high sensitivity and high accuracy, and in which said electron beam image information can be easily processed.

There is provided by the present invention a method for recording and reproducing an electron beam image information comprising:

recording an electron beam image transmitted through a sample or reflected from the sample within an electron microscope device or an electron diffraction device as an electron beam energy latent image on a stimulable phosphor sheet comprising a stimulable phosphor sheet comprising a stimulable phosphor layer having a thickness in the range of 10 to 150 $\mu$m or a stimulable phosphor layer having an exposed surface without a protective layer on the surface of the layer;

irradiating said stimulable phosphor sheet with an electromagnetic wave to release at least a portion of electron beam energy stored in said stimulable phosphor sheet as stimulated emission;

detecting said stimulated emission; and photoelectrically processing the detected stimulated emission to obtain an electron beam image information on the sample.

The term "electron beam image information" used herein is intended to include an electron beam image per se and a digital information expressed as symbols subh as numeral combinations with respect to the electron beam images.

DETAILED DESCRIPTION OF THE INVENTION

Figure 1:
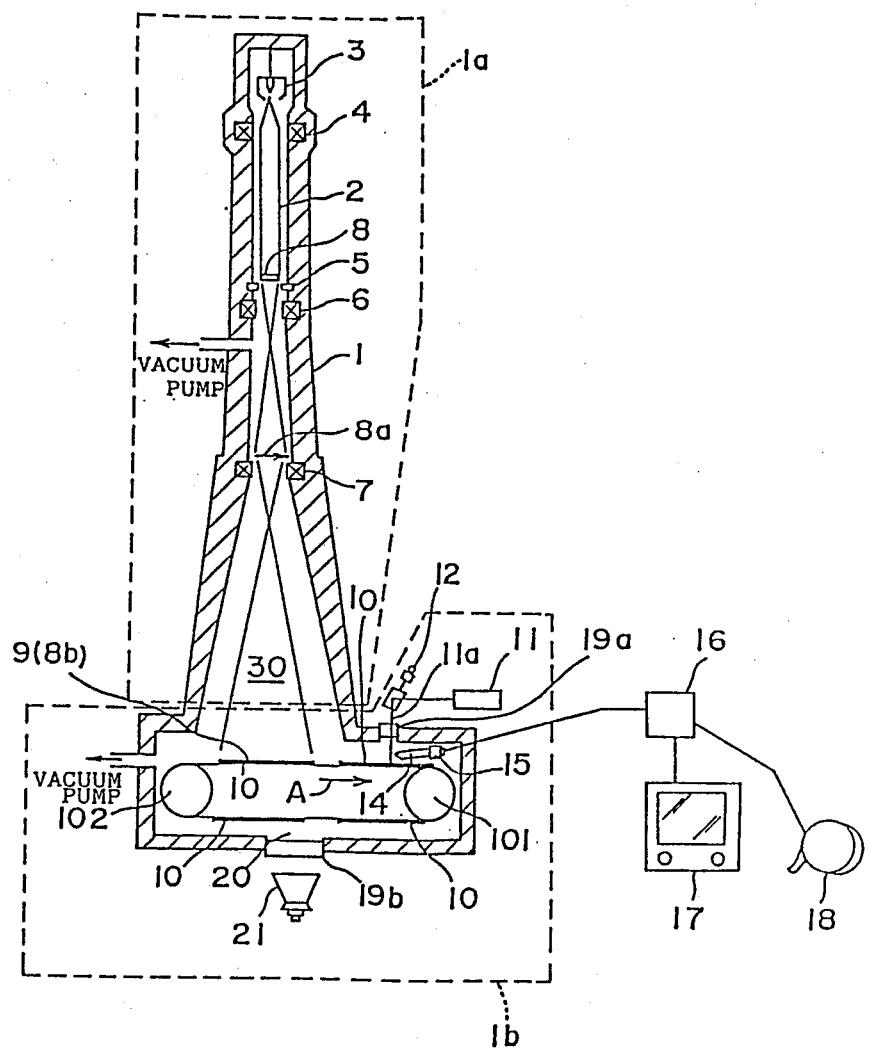
FIG. 1 schematically illustrates an embodiment of an electron microscope image recording and reproducing device which can be used for performing the method for recording and reproducing an electron beam image information accorcding to the present invention.

The present invention is characterized in that the stimulable phosphor sheet (which is alternatively called "radiation image storage panel") comprising the specifically defined stimulable phosphor layer, that is, a stimulable phosphor layer having a thickness in the range of 10 to 150 $\mu$m or having an exposed surface with no protective layer thereon is used as a medium for recording and reproducing an electron beam image of a sample, said image being formed in an electron microscope device or an electron diffraction device.

The stimulable phosphor sheet comprises basically a support and at least one phosphor layer provided thereon. The basic structure of the stimulable phosphor sheet is already known. The phosphor layer comprises a stimulable phosphor dispersed in a binder. The stimulable phosphor sheet has been heretofore used for a radiographic image recording and repreducing method. The known radiographic image recording and repreducing method uses, in practice, a stimulable phosphor sheet having a relatively thick phosphor layer such as of around 200 $\mu$m thick. Moreover, the practically employed stimulable phosphor sheet has usually a transparent protective layer on the surface (surface of a side which does not face the support) of the phosphor layer to protect the phosphor layer from chemical deterioration or physical shock.

It has been now found by the present inventors that the stimulable phosphor layer of the stimulable phosphor sheet employed in the method for recording and reproducing an electron beam image information advantageously has a less thickness such as a thickness in the range of 10 to 150 $\mu$m and/or has no protective layer. Further has been found that if a protective layer is provided on the phosphor layer, its thickness preferably is less than the thickness of a stimulable phosphor layer of a generally employed stimulable phosphor sheet.

The reason is thought as follows.

An electron beam of short wavelength employed in an electron microscope device or an electron deffraction device is absorbed by a stimulable phosphor more efficiently than X rays. Accordingly, a greater portion of an electron beam impinged on the stimulable phosphor layer is absorbed by the stimulable phosphor located in the vicinity of the surface of the phosphor layer, and the stimulable phosphor located in a zone deeper than a certain level does not efficiently contribute to the formation of a latent image. On the contrary, an electromagnetic wave such as a laser beam employed for stimulating the phosphor to produce an emission is scattered by a phosphor located in the deep zone. Such scattering of the stimulating rays lowers sharpness of the reproduced image.

Further, the electron beam and the stimulating rays both are scattered by a plastic material of the protective layer.

For this reason, it has been noted by the inventors that there is an optimum range of thickness of the stimulable phosphor layer in which the sensitivity and sharpness are well balanced. Thus determined range of thickness of the stimulable phosphor layer is from 10 to 150 $\mu$m. Further, it has been discovered that the protective layer which unfavorably serves to lower the sharpness but favorably protects the phosphor layer has preferably a thickness of not more than 5 $\mu$m (more preferably not more than 4 $\mu$m), if it is provided on the phosphor layer.

The stimulable phosphor sheet employed in the present invention having the above-described advantages can be prepared, for instance, in the following manner.

The support material of the stimulable phosphor sheet can be selected from those employed in the conventional radiographic intensifying screens or those employed in the known stimulable phosphor sheets. Examples of the support material include plastic films such as films of cellulose acetate, polyester, polyethylene terephthalate, polyamide, polyimide, triacetate and polycarbonate; metal sheets such as aluminum foil and aluminum alloy foil; ordinary papers; baryta paper; resin-coated papers; pigment papers containing titanium dioxide or the like; and papers sized with polyvinyl alcohol or the like. From the viewpoint of characteristics of a stimulable phosphor sheet as an information recording material, a plastic film is preferably employed as the support material of the invention. The plastic film may contain a light-absorbing material such as carbon black, or may contain a light-reflecting material such as titanium dioxide.

In the preparation of a known stimulable phosphor sheet, one or more additional layers are occasionally provided between the support and the phosphor layer, so as to enhance the adhesion between the support and the phosphor layer, or to improve the sensitivity of the sheet or the quality of an image (sharpness and graininess) provided thereby. For instance, a subbing layer may be provided by coating a polymer material such as gelatin over the surface of the support on the phosphor layer side. Otherwise, a light-reflective layer or a light-absorbing layer may be provided by forming a polymer material layer containing a light-rfeflective material such as titanium dioxide or a light-absorbing material such as carbon black. Specifically advantageous light-reflective layer is one which gives a reflectance of not lower than 40% for a light at 390 nm and a reflectance of not higher than 90% at a light at 633 nm is provided to the stimulable phosphor layer on the side opposite to the side of the exposed surface. This reflective-layer is advantageous to improve the sharpness of a reproduced image. Such light-reflective layer can be prepared by coating a binder solution containing a light-reflective material such as titanium dioxide and a dye such as ultramarine blue on a support and then drying the coated layer.

As described in Japanese Pat. Provisional Publication No. 58(1983)-200200 (corresponding to U.S. Pat. application No. 496,278), the phosphor layer-side surface of the support (or the surface of a subbing layer, light-reflective layer, or light-absorbing layer in the case that such layers are provided on the phosphor layer) may be provided with protruded and depressed portions for enhancement of the sharpness of a reproduced image.

On the support, optionally via an intermediate layer such as described above, a stimulable phosphor layer is formed. The stimulable phosphor layer basically comprises a binder and stimulable phosphor particles dispersed therein.

The stimulable phosphor gives stimulated emission when excited with stimulating rays after exposure to a radiation of an electron beam. From the viewpoint of practical use, the stimulable phosphor is desired to give stimulated emission in the wavelength region of 300–500 nm when excited with stimulating rays in the wavelength region of 400–900 nm.

Examples of the stimulable phosphor employable in the stimulable phosphor sheet of the invention include:

SrS:Ce,Sm, SrS:Eu,Sm, ThO$_2$:Er, and La$_2$O$_2$S:Eu,Sm, as described in U.S. Pat. No. 3,859,527;

ZnS:Cu,Pb, BaO·xAl$_2$O$_3$:Eu, in which x is a number satisfying the condition of $0.8 \leq x \leq 10$, and M$^{2+}$O·xSiO$_2$:A, in which M$^{2+}$ is at least one divalent metal selected from the group consisting of Mg, Ca, Sr, Zn, Cde and Ba, A is at least one element selected from the group consisting of Ce, Tb, Eu, Tm, Pb, Tl, Bi and Mn, and x is a number satisfying the condition of $0.5 \leq x \leq 2.5$, as described in U.S. Pat. No. 4,326,078;

$(Ba_{1-x-y},Mg_x,Ca_y)FX:aEu^{2+}$, in which X is at least one element selected from the group consisting of Cl and Br, x and y are numbers satisfying the conditions of $0 < x+y \leq 0.6$, and $xy \neq 0$, and a is a number satisfying the condition of $10^{-6} \leq a \leq 5 \times 10^{-2}$, as described in Japanese Pat. Provisional Publication No. 55(1980)-12143;

LnOX:xA, in which Ln is at least one element selected from the gorup consisting of La, Y, Gd and Lu, X is at least one element selected from the group consisting of Cl and Br, A is at least one element selected from the group consisting of Ce and Tb, and x is a number satisfying the condition of $0 < x < 0.1$, as described in the above-mentioned U.S. Pat. No. 4,236,078;

$(Ba_{1-x},M^{II}_x)FX:yA$, in which $M^{II}$ is at least one divalent metal selected from the group consisting of Mg, Ca, Sr, Zn and Cd, X is at least one element selected from the group consisting of Cl, Br and I, A is at least one element selected from the group consisting of Eu, Tb, Ce, Tm, Dy, Pr, Ho, Nd, Yb and Er, and x and y are numbers satisfying the conditions of $0 \leq x \leq 0.6$ and $0 \leq y \leq 0.2$, respectively, as described in U.S. Pat. No. 4,239,968;

$M^{II}FX \cdot xA:yLn$, in which $M^{II}$ is at least one element selected from the group consisting of Ba, Ca, Sr, Mg, Zn and Cd; A is at least one compound selected from the group consisting of BeO, MgO, CaO, SrO, BaO, ZnO, $Al_2O_3$, $Y_2O_3$, $La_2O_3$, $In_2O_3$, $SiO_2$, $TiO_2$, $ZrO_2$, $GeO_2$, $SnO_2$, $Nb_2O_5$, $Ta_2O_5$ and $ThO_2$; Ln is at least one element selected from the group consisting of Eu, Tb, Ce, Tm, Dy, Pr, Ho, Nd, Yb, Er, Sm and Gd; X is at least one element selected from the group consisting of Cl, Br and I; and x and y are numbers satisfying the conditions of $5 \times 10^{-5} \leq x \leq 0.5$ and $0 < y \leq 0.2$, respectively, as described in Japanese Pat. Provisional Publication No. 55(1980)-160078;

$(Ba_{1-x},M^{II}_x)F_2 \cdot aBaX_2:yEu,zA$, in which $M^{II}$ is at least one element selected from the group consisting of Be, Mg, Ca, Sr, Zn and Cd; X is at least one element selected from the group consisting of Cl, Br and I; A is at least one element selected from the group consisting of Zr and Sc; and a, x, y and z are numbers satisfying the conditions of $0.523 \leq a \leq 1.25$, $0 \leq x \leq 1$, $10^{-6} \leq y \leq 2 \times 10^{-1}$, and $0 < z \leq 10^{-2}$, respectively, as described in Japanese Pat. Provisional Publication No. 56(1981)-116777;

$(Ba_{1-x},M^{II}_x)F_2 \cdot aBaX_2:yEu,zB$, in which $M^{II}$ is at least one element selected from the group consisting of Be, Mg, Ca, Sr, Zn and Cd; X is at least one element selected from the group consisting of Cl, Br and I; and a, x, y and z are numbers satisfying the conditions of $0.5 \leq a \leq 1.25$, $0 \leq x \leq 1$, $10^{-6} \leq y \leq 2 \times 10^{-1}$, and $0 < z \leq 2 \times 10^{-1}$, respectively, as described in Japanese Pat. Provisional Publication No. 57(1982)-23673;

$(Ba_{1-x},M^{II}_x)F_2 \cdot aBaX_2:yEu,zA$, in which $M^{II}$ is at least one element selected from the group consisting of Be, Mg, Ca, Sr, Zn and Cd; X is at least one element selected from the group consisting of Cl, Br and I; A is at least one element selected from the group consisting of As and Si; and a, x, y and z are numbers satisfying the conditions of $0.5 \leq a \leq 1.25$, $0 \leq x \leq 1$, $10^{-6} \leq y \leq 2 \times 10^{-1}$, and $0 < z \leq 5 \times 10^{-1}$, respectively, as described in Japanese Pat. Provisional Publication No. 57(1982)-23675;

$M^{III}OX:xCe$, in which $M^{III}$ is at least one trivalent metal selected from the group consisting of Pr, Nd, Pm, Sm, Eu, Tb, Dy, Ho, Er, Tm, Yb, and Bi; X is at least one element selected from the group consisting of Cl and Br; and x is a number satisfying the condition of $0 < x < 0.1$, as described in Japanese Pat. Provisional Publication No. 58(1983)-69281;

$Ba_{1-x}M_{x/2}L_{x/2}FX:yEu^{2+}$, in which M is at least one alkali metal selected from the group consisting of Li, Na, K, Rb and Cs; L is at least one trivalent metal selected from the group consisting of Sc, Y, La, Ce, Pr, Nd, Pm, Sm, Gd, Tb, Dy, Ho, Er, Tm, Yb, Lu, Al, Ga, In and Tl; X is at least one halogen selected from the group consisting of Cl, Br and I; and x and y are numbers satisfying the conditions of $10^{-2} \leq x \leq 0.5$ and $0 < y \leq 0.1$, respectively, as described in U.S. patent application No. 497,805;

$BaFX \cdot xA:yEu^{2+}$, in which X is at least one halogen selected from the group consisting of Cl, Br and I; A is at least one fired product of a tetrafluoroboric acid compound; and x and y are numbers satisfying the conditions of $10^{-6} \leq x \leq 0.1$ and $0 < y \leq 0.1$, respectively, as described in U.S. Pat. application No. 520,215;

$BaFX \cdot xA:yEu^{2+}$, in which X is at least one halogen selected from the group consisting of Cl, Br and I; A is at least one fired product of a hexafluoro compound selected from the group consisting of monovalent and divalent metal salts of hexafluoro silicic acid, hexafluoro titanic acid and hexafluoro zirconic acid; and x and y are numbers satisfying the conditions of $10^{-6} \leq x \leq 0.1$ and $0 < y \leq 0.1$, respectively, as described in U.S. Pat. application No. 502,648;

$BaFX \cdot xNaX':aEu^{2+}$, in which each of X and X' is at least one halogen selected from the group consisting of Cl, Br and I; and x and a are numbers satisfying the conditions of $0 < x \leq 2$ and $0 < a \leq 0.2$, respectively, as described in Japanese Pat. Provisional Publication No. 59(1984)-56479;

$M^{II}FX \cdot xNaX':yEu^{2+}:zA$, in which $M^{II}$ is at least one alkaline earth metal selected from the group consisting of Ba, Sr and Ca; each of X and X' is at least one halogen selected from the group consisting of Cl, Br and I; A is at least one transition metal selected from the group consisting of V, Cr, Mn, Fe, Co and Ni; and x, y and z are numbers satisfying the conditions of $0 < x \leq 2$, $0 < y \leq 0.2$ and $0 < z \leq 10^{-2}$, respectively, as described in U.S. Pat. application No. 535,928; and $M^{II}FX \cdot aM^IX' \cdot bM'^{II}X''_2 \cdot cM^{III}X'''_3 \cdot xA:yEu^{2+}$, in which $M^{II}$ is at least one alkaline earth metal selected from the group consisting of Ba, Sr and Ca; $M^I$ is at least one alkali metal selected from the group consisting of Li, Na, K, Rb and Cs; $M'^{II}$ is at least one divalent metal selected from the group consisting of Be and Mg; $M^{III}$ is at least one trivalent metal selected from the group consisting of Al, Ga, In and Tl; A is at least one metal oxide; X is at least one halogen selected from the group consisting of Cl, Br and I; each of X', X'' and X''' is at least one halogen selected from the group consisting of F, Cl, Br and I; a, b and c are numbers satisfying the conditions of $0 \leq a \leq 2$, $0 \leq b \leq 10^{-2}$, $0 \leq c \leq 10^{-2}$ and $a+b+c \geq 10^{-6}$; and x and y are numbers satisfying the conditions of $0 < x \leq 0.5$ and $0 < y \leq 0.2$, respectively, as described in U.S. Pat. application No. 543,326.

Among the above-described stimulable phosphors, the divalent europium activated alkaline earth metal fluorohalide phosphor and rare earth element acitivated rare earth oxyhalide phosphor are particularly preferred, because these show stimulated emission of high luminance. The above-described stimulable phosphors are given by no means to restrict the stimulable phosphor employable in the present invention. Any other phosphors can be also employed, provided that the phosphor gives stimulated emission when excited with stimulating rays after exposure to radiation of an electron beam.

Examples of the binder to be contained in the phosphor layer include: natural polymers such as proteins (e.g. gelatin), polysaccharides (e.g. dextran) and gum arabic; and synthetic polymers such as polyvinyl butyral, polyvinyl acetate, nitrocellulose, ethylcellulose, vinylidene chloride-vinyl chloride copolymer, polyalkyl (meth)acrylate, vinyl chloride-vinyl acetate copoymer, polyurethane, cellulose acetate butyrate, polyvinyl alcohol, and linear polyester. Particularly preferred are nitrocellulose, linear polyester, polyalkyl (meth)acrylate, a mixture of nitrocellulose and linear polyester, and a mixture of nitrocellulose and polyalkyl (meth)acrylate. These binders may be crosslinked with a crosslinking agent.

The phosphor layer can be formed, for instance, by the following procedure.

In the first place, stimulable phosphor particles and a binder are added to an appropriate solvent, and they are mixed to prepare a coating dispersion comprising the phosphor particles homogeneously dispersed in the binder solution.

Examples of the solvent employable in the preparation of the coating dispersion include lower alcohols such as methanol, ethanol, n-propanol and n-butanol; chlorinated hydrocarbons such as methylene chloride and ethylene chloride; ketones such as acetone, methyl ethyl ketone and methyl isobutyl ketone; esters of lower alcohols with lower aliphatic acids such as methyl acetate, ethyl acetate and butyl acetate; ethers such as dioxane, ethylene glycol monoethylether and ethylene glycol monoethyl ether; and mixtures of the above-mentioned compounds.

The ratio between the binder and the stimulable phosphor in the coating dispersion may be determined according to the characteristics of the aimed stimulable phosphor sheet and the nature of the phosphor employed. Generally, the ratio therebetween is within the range of from 1:1 to 1:100 (binder:phosphor, by weight), preferably from 1:8 to 1:40.

The coating dispersion containing the phosphor particles and the binder prepared as described above is applied evenly onto the surface of the support to form a layer of the coating dispersion. The coating procedure can be carried out by a conventional method such as a method using a doctor blade, a roll coater or a knife coater.

After applying the coating dispersion onto the support, the coating dispersion is then heated slowly to dryness so as to complete the formation of a phosphor layer having an appropriate thickness.

The phosphor layer can be provided onto the support by the methods other than that given in the above. For instance, the phosphor layer is initially prepared on a sheet (tentative support) such as a glass plate, metal plate or plastic sheet using the aforementioned coating dispersion and then thus prepared phosphor layer is superposed on the genuine support by pressing or using an adhesive agent.

The ratio of the stimulable phosphor particle to the binder in the stimulable phosphor layer prepared as above is substantially uniform it the depth direction, or somewhat varies toward a deeper area of the phosphor layer. The ratio is almost uniform over the whole layer.

The stimulable phosphor sheet used in the present invention can be so formed that the surface phase of the phosphor layer is substantially composed of only a binder and a zone in which the phosphor particles are present is located in a somewhat deep portion. If the phosphor layer has such a structure, the surface phase composed substantially of only a binder performs a function of protecting the phosphor layer, whereby no protective film is needed. However, it is desirable that the surface phase composed substantially of only a binder is not extended beyond a level spaced by 5 $\mu$m from the surface of the phosphor layer. If the surface phase composed substantially of only binder is extended beyond a depth of 10 $\mu$m in the phosphor layer, it is difficult to record and reproduce an electron beam image information having excellent image sharpness. Accordingly, when the surface phase composed substantially of only a binder is formed in the phosphor layer, it is desirable that the weight ratio of the phosphor particle contained in the zone between the surface of the phosphor layer and a level of 5 $\mu$m deep (preferable 3 $\mu$m deep) to the binder (phosphor/binder) is not less 0.2.

The phosphor layer having the surface phase composed substantially of only a binder can be formed, for instance by a simultaneous double coating method wherein a first coating solution containing the phosphor particle and a binder and a second coating solution containing only a binder are coated on a support in such a manner that the latter is placed over the former.

A stimulable phosphor sheet generally has a transparent protective layer and the formation thereof is usually carried out by combining a previouisly prepared thin film with a phosphor layer using an adhesive agent.

Examples of the material employable for the formation of a protective layer include transparent thin films of cellulose derivatives such as cellulose acetate and nitrocellulose and synthetic polymers such as polymethyl methacrylate, polyvinylbutyral, polyvinylformal, polycarbonate, polyethylene terephthalate, polyethylene, vinylidene chloride, polyamide, polyvinyl acetate, and vinyl chloride/vinyl acetate copolymer. Alternatively, the transparent protective film can be prepared by coating a polymer solution over the stimulable phosphor layer.

The phosphor layer, adhesive layer and protective layer can be colored to improve sharpness of a reproduced image.

The colorant employed for coloring these layers is one capable of absorbing at least a portion of the stimulating rays for the stimulable phosphor constituting the phosphor layer of the stimulable phosphor sheet. The colorant preferably has such reflection characteristics that the mean reflectance in the wavelength region of the stimulating rays for the stimulable phosphor is lower than the mean reflectance in the wavelength region of the light emitted by said stimulable phosphor upon stimulation thereof.

From the viewpoint of improving the sharpness of the image provided by the stimulable phosphor sheet, it is desired that the mean reflectance of the colorant in the wavelength region of the stimulating rays is as low as possible. On the other hand, from the viewpoint of improving the sensitivity of the panel, it is desired that the mean reflectance of the colorant in the wavelength region of the light emitted by the stimulable phosphor is as high as possible.

The colorant preferably has a body color from blue to green, particularly preferred are the organic metal complex salt colorants which show no emission in the wavelength region longer than that of the stimulating rays as described in the latter U.S. Pat. application No. 326,642, from the viewpoint of the graininess and the contrast of the reproduced image.

The stimulable phosphor sheet can be in the form of an endless belt, a continuous long sheet or a generally employed rectangular sheet.

A method for recording and reproducing an electron beam image information according to the present invention will be described by referring to an embodiment using an electron microscope device.

FIG. 1 schematically illustrates a preferred electron microscope image information recording and reproducing device to be used in performing the recording and reproducing method of the invention.

Referring to FIG. 1, the electron microscope image information recording and reproducing device 1 is provided with a speculum section 1a of an electron microscope, under which there is provided a read-out section 1b comprising a stimulable phosphor sheet 10 arranged so as to allow it to be kept in the same vacuum system as that of the image formation plane of a transmitted electron beam image at least during the recording stage of electron microscope image information; a stimulating means for scanning the stimulable phosphor sheet, kept under vacuum, with stimulating rays; and a detecting means for photoelectrically detecting a stimulated emission released from the stimulable phosphor sheet 10. The part (inside of the hausing with hatching) of the read-out secton 1b and the speculum section 1a are kept under vacuum during the working of the electron microscope by any of conventional methods.

The speculum section 1a comprises an electron gun 3 emitting electron beam (rays) 2 at a uniform rate; at least one converging lens 4 comprising, for instance, an electrostatic lens and a magnetic lens for converging the electron beam 2 into a sample plane; a sample stage 5; an objective lens 6 similar to the converging lens 4; and a projection lens 7. The electron beam 2 transmitted through a sample 8 placed ont he sample stage 5 are refracted by the objective lens 6 to form the enlarged scattered image 8a of the sample 8. The image 8a is projected by means of the projection lens 7 to form image (numberal 8b) on an image formation plane 9.

The read-out section 1b is provided with a plurality of the stimulable phosphor sheets 10 fixedonto an endless belt stretched between a cylindrical driving roller 101 and cylindrical driven roller 102; a stimulating means comprising a stimulating ray source 11 such as He-Ne laser tube and a beam deflector 12 such as galvanometer mirror for deflecting stimulating beams 11a generated from the stimulating source 11 in the width direction of the sheet 10; and a detecting means comprising a photoelectric converter 15 such as photomultiplier which is provided at the emitting end of a condenser 14 condensing stimulated emission released from the sheet 10 by the irradiation of stimulating rays and photoelectrically converts said stimulated emission into an electric signal. The endless belt is moved in the direction of an arrow A by means of the driving loller 101 which is rotated by a driving device (not shown).

When a shutter (not shown) provided between the speculum section 1a and the read-out section 1b is opened, the stimulable phosphor sheet 10 arranged in the recording position (i.e. image formation plane) is irradiated with an electron beam transmitted (passed) through a sample and an electron beam energy image (latent image) corresponding to enlarged scattered image 8b of the sample is recorded and stored. The phosphor sheet 10 is then moved to a read-out position by the rotation of the driving roller. In the device of FIG. 1, the image-stored area is scanned in such a manner that stimulating rays 11a are generated from the stimulating ray source 11 such as a laser beam source externally provided, deflected by the beam deflector 12 such as galvanometer mirror, passed through a light transmissive wall member 19a such as lead glass and enter the stimulable phosphor sheet 10 to scan it in the width direction and the sheet 10 is transferred in the direction of an arrow A (perpendicular to the width direction) by means of the driving roller 101, thus scanning the image stored area on the sheet 10. The stimulated emission released from the phosphor sheet by the irradiation of the stimulating rays is collected through the edge face (facing the sheet 10) of the condenser 14 and introduced into the condenser 14. The stimulated emission is then guided under repeated whole reflection within the condenser 14 and continuously received by the photomultiplier 15 where the amount of the stimulated emission is photoelectrically detected in order.

The electric signal read out by the photomultiplier 15 is transferred to an image processing circuit 16, and then transferred to an image reproducing device, after necessary image processing is carried out. The image reproducing device may be a display 17 such as CRT, a recording device in which a light scanning recording is made on a photographic film, or a memory 18 such as a magnetic tape.

After the completion of the read-out operation, the stimulable phosphor sheet 10 placed on the belt is transferred to an erasing zone 20 where the sheet 10 is irradiated with an erasing light which is emitted from an erasing light source 21 such as a fluorescent lamp provided outside the vacuum system and passed through a light-transmissive wall member 21. The sheet 10 is irradiated with light in the stimulable wavelength region of the stimulable phosphor provided from the quenching beam source 21, whereby the residual image stored in the sheet 10 and noise due to radioactive elements contained in the material of sensor are removed. Examples of the erasing light source include tungsten lamp, halogen lamp, infrared lamp and laser beam source as disclosed in Japanese Pat. Provisional Publication No. 56(1981)-11392.

While an embodiment of a metod for recorrding and reproducing the enlarged scattered image with an electron beam has bene illustrated above, the present invention can be applied to a method for recording and reproducing the diffraction pattern of the sample as described above.

Figure 2:
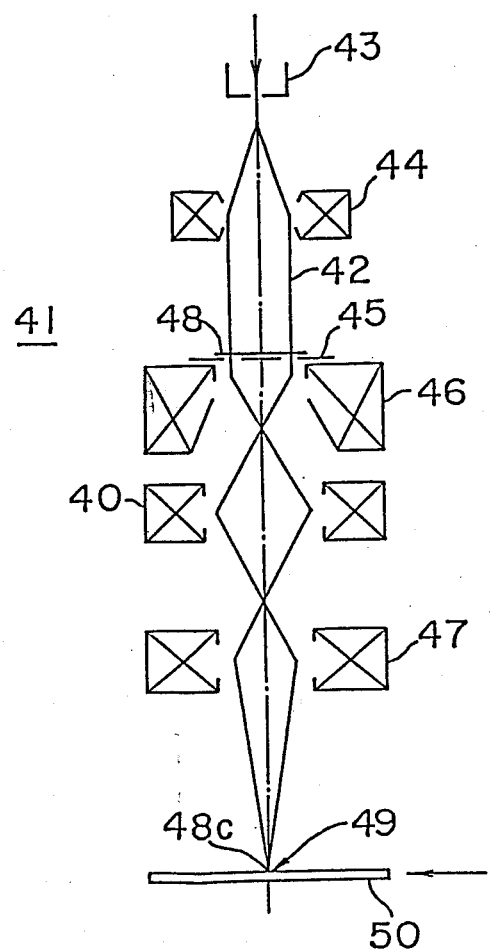
FIG. 2 schematically illustrates another embodiment of the recording and reproducing device.

FIG. 2 shows an embodiment to record the diffraction pattern 48c of a sample 48. In this embodiment, an electron microscope 41 is provided with an intermediate lens 40 between an objective lens 46 and a projection lens 47. The diffraction pattern 48c of the sample formed on the back focal plane of the objective lens is enlargeprojected on an image formation plane 49 by the projection lens 47 and the intermediate lens 40 which is focused on the back focal plane. When the stimulable phosphor sheet 10 (50) is provided on the image formation plane, the enlarged image (latent image) of the diffraction pattern 48c is recorded on the sheet 10 by transmitted enlarged electron beam 42. The recorded diffraction pattern 48c can be read out in the same manner as that of FIG. 1, and the read-out image can be displayed on CRT or can be reproduced in the form of a hard copy.

In order to eliminate fluctuation in recording conditions and obtain an electron microscope image having well acceptable observability, it is desirable that recording patterns influenced by the recorded state of transmitted enlarged image (latent image) stored in the phosphor sheet 10 (50), sample properties, recording methods, etc. are examined prior to the output of visible image to observe the sample, and read-out gains are adjusted to appropriate values based on the examined recorded information, or appropriate signal processing is carried out.

Further, in order to obtain a reproduced image having excellent observability, it is required that scale factor setting value is determined so as to set the resolving power at an optimum level corresponding to the contrast of the recorded pattern.

An example of a method for examining information stored in the phosphor sheet 10 (50) prior to the output of the visible image is disclosed, for instance, in Japanese Pat. Provisional Publication No. 58(1983)-89245. For instance, before a final read-out operation for obtaining a visible image to observe the sample 48 is performed, a preliminary read-out operation is performed with stimulating rays having lower energy than that of the stimulating rays to be used for the final read-out operation to previously examine information recorded on the phosphor sheet. The read-out gains are set to appropriate values determined upon the results of the preliminary read-out operation, and the final read-out operation is carried out, or signal processing is conducted.

As means for photoelectrically reading out the stimulated emission released from the stimulable phosphor sheet 10 (50), the aforementioned photomultiplier 15 and solid photoelectric conversion elements such as photoconductor and photodiode can be used (see, Japanese Pat. Application Nos. 58(1983)-86226, 58(1983)-86227, 58(1983)-219313 and 58(1983)-219314 and Japanese Pat. Provisional Publication No. 58(1983)-121874). A great number of the solid photoelectric conversion elements may be integrated with the sheet 10 in such a manner that the elements are provided so as to cover the whole surface of the sheet 10 (50) with the elements. The elements may be provided in the close vicinity of the sheet 10 (50). Teh photoelectrical read-out means may be a line sensor wherein a plurality of the photoelectric conversion element corresponding to one image element may be provided so that the element can be moved over the whole surface of the sheet 10 (50) to scan it.

Examples of read-out light sources in the above case include a point source such as laser and a line source such as array where luminescent diodes or semiconductor lasers are arranged in series. When such a device is used to perform the read-out operation, the read-out efficiency of the stimulated emission released from the phosphor sheet 10 (50) can be increased and at the some time the light-receiving solid angle is enlarged, whereby S/N can be enhanced. Further, the resulting electric signal can be obtained in time sequence not by the time series irradiation of the stimulated emission, but by the electrical processing of a photosensor, and hence, the read-out rate can be increased.

In the method described above, the read-out operation of the electron beam image such as transmitted enlarged electron beam image (latent image) recorded on the stimulable phosphor sheet is carried out in the system under vacuum conditions, but this operation can be carried out after the sheet in taken out of the vacuum system.

In reading out the electron beam image recorded on the phosphor sheet and reproducing it, the image can be reproduced as visible image, or the image can be displayed as symbols or numerical values.

According to the present invention, an electron beam image having well-balanced sensitivity and sharpness is recorded on the stimulable phosphor sheet. Hence, an electron beam image information can be reproduced with high accuracy, the dose of electron beam can be reduced and the damage of a sample is reduced. Further, the reproduced image can be immediately displayed on a CRT with high accuracy so that when the reproduced image is used as a monitor image for adjusting the focus of electron microscope or electron diffraction, a clear image can be given and it becomes possible to adjust focus at a low electron beam dose, while focus can not be adjusted at such a low dose in conventional methods.

In the present invention, the electron beam image information is read out as an electric signal so that the electron beam image information can be very easily subjected to image processings such as gradation processing and frequency intensifying processing, and the aforementioned diffraction pattern processing, the reconstruction of three-dimensional image and image analysis such as the formation of binary image can be carried out simply and rapidly when the electric signal is input into a computer.

Further, the stimulable phosphor sheet to be used for recording and storing the electron beam image information can be subjected to processings such as light irradiation and heat processing, whereby the sheet can be repeatedly used. Accordingly, the electron beam image information is not only very accurate, but also can be economically reproduced.

The following exmaples further illustrate the present invention.

EXAMPLE 1

To a mixture of a divalent europium activated barium fluorobromide ($BaFBr:0.0005Eu^{2+}$) phosphor particles and a linear polyester resin were added successively methyl ethyl ketone and hitrocellulose (nitration degree: 11.5%) to prepare a dispersion containing the phosphor particles. Tricresyl phosphate, n-buthanol and methyl ethyl ketone were added to the dispersion and the mixture was sufficiently stirred by means of a propeller agitater to obtain a homogeneous coating dispersion having a viscosity of 25–35 PS (at 25° C.) in which a ratio of binder to phosphor was 1:10.

Subsequently, the coating dispersion was applied evenly onto a polyethylene terephthalate sheet containing titanium dioxide (support, thickness: 250 μm) placed horizontally on a glass plate. The application of the coating dispersion was carried out using a doctor blade. After the coating was complete, the support having the coating dispersion was placed in an oven and heated at a temperature gradually rising from 25° to 100° C. Thus, a phosphor layer having a thickness in the range of 32 to 160 μm (32, 50, 80, 112 and 160 μm) was formed on the support.

A transparent polyethylene terephthalate film (thickness: 6 μm, provided with an adhesive layer of a polyester adhesive) was placed on the phosphor layer in such a manner that said adhesive layer faced the phosphor layer and then combined therewith through the adhesive layer. Thus, a stimulable phosphor sheet consisting of a support, a phosphor layer, a colored adhesive layer and a transparent protective film was prepared.

The obtained stimulable phosphor sheets were examined in the following tests.

Electron microscope image recording and reproducing test (1) Electron microscope The measurement was made under the following electron beam irradiation conditions using an electron microscope (JEM-100CX) manufacutred by Japan Electron Optics Laboratory Co., Ltd. Accelerating voltage: 100 KV Current density: $1.4 \times 10^{-10}$ A/cm$^2$ Irradiation period: one second (2) Measurement of sensitivity The stimulable phosphor sheet was exposed to X-rays at voltage of 80 KVp and subsequently scanned with an He-Ne laser beam to excite the phosphor. The light emitted by the phosphor layer of the phosphor sheet was detected by means of a photosensor to measure a sensitivity thereof.

Figure 3:
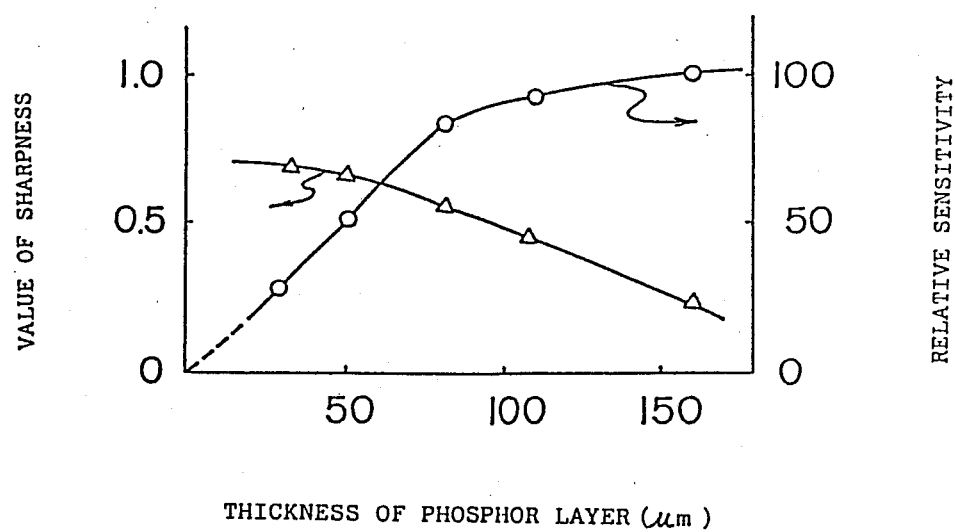
FIG. 3 graphically illustrates a relationship between a thickness of the stimulable phosphor layer and a sensitivity of a stimulable phosphor sheet having said phosphor layer and a relationship between a thickness of the stimulable phosphor layer and a sharpness of a stimulable phosphor sheet having said phosphor layer.

The measured sensitivity is graphically illustrated in FIG. 3 as a relative value in which a sensitivity measured on the stimulable phosphor sheet having a stimulable phosphor layer of 160 μm thick is set to 100.

(3) Measurement of image sharpness

There were used charts (0.50 line·pair/mm–1.6 line·pair/mm–5.00 line·pair/mm) for the measurement of image sharpness wherein there were a plurality of pairs of line units in which three black lines having the same line width were arranged at regular intervals in the width direction and the line width and the line space varied in order, and the chart were used in parallel. The charts were placed on the stimulable phosphor sheets and irradiated with an electron beam under the aforementioned conditions. The sheet was then scanned with He-Ne laser beam (wavelength: 632.8nm) to excite the phosphor. The stimulated released from the phosphor layer was received by a light detector (photomultiplier having spectral snesitivity of S-5) to convert it into an electric signal. The electric signal was reproduced as a visible image on a film in an image reproducing device to obtain a chart image for use in the determination of image sharpness. The density distribution of the chart image was read by a microphotometer. The value (B/A) obtained by dividing the output amplitude (B) of chart image corresponding to 1.60 line·pair/mm by the output amplitude (A) of chart image corresponding to 0.50 line·pair/mm was taken as the sharpness value. The criterion is such that the larger the sharpness value, the higher the sharpness of the image.

The results are graphically illustrated in FIG. 3.

According to the results shown in FIG. 3, it is clear that stimulable phosphor sheets having a stimulable phosphor layer of a thickness in the range of 10 to 150 μm is very advantageous recording and reproducing means because these sheets show well balanced sensitivity and sharpness in the method for recording and reproducing an electron beam image.

EXAMPLE 2

A stimulable phosphor sheet having a stimulable phosphor layer of 80 μm thick and a transparent protective layer of 4 μm thick on the phosphor layer was prepared in essentially the same manner as described in Example 1.

COMPARISON EXAMPLE 2

The procedure of Example 2 was repeated except that a transparent protective layer of 6 μm thick is employed to prepare a stimulate phosphor sheet.

The stimulable phosphor sheets obtained in Example 2 and Comparative Example 2 were examined with respect to the sharpness of a reproduced image in the manner as described above.

The results are set forth in Table 1.

TABLE 1

| Example | Thickness of Protective Layer | Sharpness Value |
|---|---|---|
| Example 2 | 4 μm | 0.93 |
| Com. Example 2 | 6 μm | 0.87 |

EXAMPLE 3

A stimulable phosphor sheet having a stimulable phosphor layer of 160 μm thick and no protective layer was prepared in essentially the same manner as described in Example 1.

COMPARISON EXAMPLE 3

The procedure of Example 3 was repeated except that a transparent protective layer of 6 μm thick is employed to prepare a stimulable phosphor sheet.

The stimulable phosphor sheets obtained in Example 3 and Comparative Example 3 were examined with respect to the sharpness of a reproduced image in the manner as described above.

The results are set forth in Table 2.

TABLE 2

| Example | Protective Layer | Sharpness Value |
|---|---|---|
| Example 3 | None | 0.92 |
| Com. Example 3 | 6 μm thick | 0.70 |

We claim:

1. A method for recording and reproducing an electron beam image information comprising:
    recording an electron beam image transmitted through reflected from the sample as an electron beam energy latent image on a stimulable phosphor sheet comprising a stimulable phosphor layer having a thickness in the range of 30 to 100 μm;
    irradiating said stimulable phosphor sheet with an electromagnetic wave to release at least a portion of electron beam energy stored in said stimulable phosphor sheet as stimulated emission;
    detecting the stimulated emission; and
    photoelectrically processing the detected stimulated emission to obtain an electron beam image information of the sample.

2. The method as claimed in claim 1, wherein a protective layer of a thickness of not more than 5 μm is provided on the surface of the stimulable phosphor layer.

3. The method as claimed in claim 1, wherein the surface of the stimulable phosphor layer is exposed with no protective layer.

4. The method as claimed in any one of claims 1, 2 or 3, wherein the stimulable phosphor layer of said stimulable phosphor sheet comprises a divalent europium activated alkaline earth metal halide phosphor or a rare earth element activated rare earth element oxyhalide phosphor dispersed in a binder.

5. The method as claimed in any one of claims 1, 2 or 3, wherein a reflective layer giving a reflectance of not lower than 40% for a light at 390 nm and a reflectance of not higher than 90% at a light at 633 nm is provided to the stimulable phosphor layer on the side opposite to the side of the exposed surface.

* * * * *